United States Patent [19]
Maloberti et al.

[11] Patent Number: 5,420,525
[45] Date of Patent: May 30, 1995

[54] LOW SWITCHING NOISE OUTPUT BUFFER

[75] Inventors: Franco Maloberti, Torre d'Isola; Gianmarco Marchesi, Rivergaro; Guido Torelli, Alessio, all of Italy

[73] Assignee: SGS-Thomson Microelectronics, S.r.l., Agrate Brianza, Italy

[21] Appl. No.: 84,727

[22] Filed: Jun. 28, 1993

[30] Foreign Application Priority Data

Jun. 26, 1992 [EP] European Pat. Off. ............ 92830335

[51] Int. Cl.⁶ .......................................... H03K 19/094
[52] U.S. Cl. ........................................ 326/27; 326/29; 327/131; 327/380
[58] Field of Search ................. 307/443, 263, 451, 475

[56] References Cited
U.S. PATENT DOCUMENTS

| | | | |
|---|---|---|---|
| 4,975,598 | 12/1990 | Borkar | 307/443 |
| 4,983,860 | 1/1991 | Yim et al. | |
| 5,028,818 | 7/1991 | Go Ang et al. | |
| 5,057,711 | 10/1991 | Lee et al. | |
| 5,122,690 | 6/1992 | Bianchi | 307/475 |

FOREIGN PATENT DOCUMENTS 0086333 8/1983 European Pat. Off. .
193921 4/1989 Japan .

Primary Examiner—David R. Hudspeth
Attorney, Agent, or Firm—Robert Groover

[57] ABSTRACT

The switching noise generated by a data output buffer is greatly reduced by "precharging" the output node to an intermediate voltage during a system's "dead" time. This is done with a precharging output current pulse having a constant time derivative during a first time interval and a constant time derivative of opposite sign during a second time interval, before performing the actual switching with an output current having a constant time derivative, during a third time interval. The partial precharging with a controlled, triangular-shaped, output current pulse, avoids any abrupt change of output current and thus limits switching noise. The buffer of the invention is particularly useful in high-speed memory devices.

27 Claims, 3 Drawing Sheets

LOW SWITCHING NOISE OUTPUT BUFFER

CROSS-REFERENCE TO RELATED APPLICATION

This application claims priority from European App'n 92830335.3, filed Jun. 26, 1992, which is hereby incorporated by reference.

BACKGROUND OF THE INVENTION

The present invention relates to buffers for driving a capacitive load at high speed, and particularly to buffers which are capable of being integrated in CMOS technology. A typical application of the disclosed innovations is the driving of the output nodes of an integrated circuit which must operate at a high switching speed, such as a memory or like device.

When an output buffer of an integrated circuit switches the voltage on its output node between logic levels in order to transfer a certain datum from an input node thereof to the external world, an inductive overvoltage is generated on the supply rails ($V_{DD}$ and $V_{SS}$).

The induced overvoltage is given by $$L_{para} \frac{dI_{out}}{dt},$$

, where $L_{para}$ is parasitic line inductance (typically from a few nH up to about 15 nH), and $I_{out}$ is the output current which is delivered by the buffer (in order to quickly charge or discharge the capacitance of a load connected to its output node). This overvoltage (commonly referred to as switching noise) may reach such a level as to be prejudicial to correct functioning of the integrated circuit which includes the buffer. The problem is aggravated by the fact that, in many cases, a single integrated circuit may include a plurality of output nodes having similar drive requirements in terms of speed and of capacitive load (e.g. the data outputs of a high-speed memory), where the occurrence of a simultaneous switching on a large number of output nodes is possible.

The problem of reducing the switching noise without excessively penalizing the switching speed has already been tackled in a number of proposals. For example, EP-A-0,284,357 filed on Mar. 22, 1988 by S. Oshima et al., entitled "Semiconductor Integrated Circuit Having a Data Output Buffer Circuit", suggests to maintain "separate" the supply pads and metal lines of the "internal" portion of the integrated circuit from dedicated supply pads and metal lines for powering the buffers, in order to reduce the noise which is induced on the supply lines of the internal circuitry of the device upon the switchings of the output voltage. This is motivated by the fact that the greater contribution to the parasitic inductance of a supply line is due to the connecting wire (bonding wire) between pad and pin. This approach is certainly useful, but insufficient.

Another known technique for reducing the switching noise consists in introducing appropriate phase shifts between the switching of different output nodes, in order to avoid summing the effects of a simultaneous parallel switching sign of different nodes.

Another similar technique consists in replacing a single pull-up and a single pull-down transistor of the buffer with respective sets of paralleled transistors, while also suitably phase-shifting the switchings of the multiple pull-up and/or pull-down transistors of a buffer.[1] These techniques have the drawback of depending strongly from the fabrication process, and in any case they need an accurate experimental characterization.

[1] See Wong et al., "An 11-ns 8K×18 CMOS Static RAM with 0.5 μm Devices", 23 IEEE J.SOLID-STATE CIRCUITS 1095-1103 (Oct. 1988), which is hereby incorporated by reference.

Several techniques are known which are based on precharging the output node to an intermediate voltage level, between $V_{SS}$ and $V_{DD}$, before effecting the switching.[2] In this way, the voltage swing on the output node at the switching instant is somewhat reduced, and so also is the time-variation of the current associated with the switching. This technique is useful when there is a dead time between a "request" for a new datum and the actual reading thereof, as for example in memory circuits, as will be evident to one of ordinary skill in the art.

[2] See T. Wada et at., "A 34-ns 1-Mbit CMOS SRAM Using Triple Polysilicon", 22 IEEE J.SOLID-STATE CIRCUITS 727-732 (Oct. 1987), or H. Okuyama et al., "A 7-ns 32K×8 CMOS SRAM", 23 IEEE J.SOLID-STATE CIRCUITS 1054-1059 (Oct. 1988), both of which are hereby incorporated by reference.

A similar technique is described in EP-A-0,271,331, filed on Dec. 9, 1987 by S. Takayasu, entitled: "Semiconductor Integrated Circuit". According to this reference, a precharge of the output node is carried out only when the starting output level is a logic high ("1") and is performed for reaching an output voltage value capable of appearing as a logic high level if it is applied to the input of an electronic circuit (e.g. 2.5 V). Conversely, when the starting output level is a logic low ("0"), a precharge is not performed because such a situation is not considered critical.

These precharge techniques, when applied to memories, alleviate the problem but do not eliminate it.

Another technique having a wide application for reducing the switching noise consists in controlling the driving of the pull-up and pull-down output transistors in such a way that the output current $I_{out}$ that is delivered has a peak value of its time derivative ($dI_{out}/dt$) as low as possible, subject to compatibility with switching speed requirements. For example, it has been proposed to drive the gates of the pull-up and pull-down output transistors through a series resistance, or from logic circuits which are supplied through series resistances to the positive and/or to the negative supply rails. This serves to slow down, through a pre-established time constant, the rise and fall of the driving voltage which is applied to said gate electrodes, thus making the variation of the output current which is delivered by the buffer less abrupt.[3] Performing such control of the driving voltages by means of active networks has also been proposed.[4]

[3] See EPC Application EP-A-0,251,910, filed on Jun. 25, 1987, by M. Naganuma, entitled: "CMOS Output Buffer Circuit," or Wang et al., "A 21-ns 32K×8 CMOS Static RAM with a Selectively Pumped p-Well Array", 22 IEEE J. SOLID STATE CIRCUITS 704-711 (Oct. 1987), both of which are hereby incorporated by reference.
[4] See Gubbels et al., "A 40-ns/100pF Low-Power Full-CMOS 256K (32K×8) SRAM", 22 IEEE J. SOLID-STATE CIRCUITS 741-747 (Oct. 1987); or Chu et al., "A 25-ns Low-Power Full-CMOS 1-Mbit (128.K×8) SRAM", 23 IEEE J. SOLID-STATE CIRCUITS 1078-1084 (Oct. 1988), both of which are hereby incorporated by reference.

In a co-pending commonly owned application with overlapping inventorship (Franco Maloberti, Salvatore Portaluri, and Guido Torelli, "Fast Capacitive-Load Driving Circuit for Integrated Circuits, Particularly Memories"),[5] which is hereby incorporated by reference, an output buffer is described wherein the output pull-up and pull-down transistors are driven by use of purposely generated voltage ramps, in order to reduce the switching noise.

[5] The U.S. application is 07/811,323, filed Dec. 20, 1991; the priority application (Italian App'n 22569 A/90) was filed on Dec. 28, 1991.

In general, the state of the art is such that there is room for further improving the performance of such output buffers in terms of minimizing the overvoltages induced on the supply lines (switching noise), while simultaneously ensuring a high speed which, in the case of memories, would permit attainment of extremely small access times.

SUMMARY OF THE INVENTION

A remarkable progress toward this end is achieved by the disclosed inventions, which provide improved methods and circuits for driving a capacitive load with low switching noise and high speed.

Basically, the inventive methods teach precharging the output node of a buffer to an intermediate level between a voltage pre-existing on the output node and a pre-established voltage, which in general terms may be a logic voltage representative of a certain datum, by an output current having a time derivative which is substantially constant and of a first sign during a first time interval, and a time derivative substantially constant and of a sign opposite to the preceding one, during a second time interval, and finally effecting a switching of the output node voltage in function of a certain logic signal which is applied to an input node of the buffer circuit by a current having a substantially constant time derivative, during a third time interval.

Preferably, the time derivatives of the different output currents of the buffer during the three time intervals have an identical absolute value. The fact that the time derivatives have the same absolute value at least during said first and second time intervals, produces a waveform of the current delivered through the output node of the buffer which is substantially triangular (or more precisely having an isosceles triangle shape) during such a precharge phase. Of course, the condition of constancy, in terms of absolute value, of the time derivative of the output current is an ideal condition, which the behavior of the real circuit merely approximates. In practice, a "soft" or "rounded" shape of the waveform is obtained which substantially approaches the ideal condition.

A fundamental requisite of this particular embodiment is that the output current be controlled during a whole switching cycle, i.e. during a precharge phase and during a subsequent switching phase of the output voltage, with particular attention to the instant when the sign of the time derivative of the current during the precharge phase inverts itself, i.e. at the instant when the output current from a rising phase passes to a decreasing phase. By the term "precharge", it is obviously intended to identify both a capacitance charging process as well as a capacitance discharging process, i.e. a process for "prearranging" to a certain (intermediate) state of charge on the node capacitance. If such a control is not actuated and, for example, the precharge process is stopped abruptly when the output voltage reaches a certain preset intermediate value, a sharp drop of the output current (precharge current) could occur from which a switching noise peak which could also be extremely high, could ensue. Therefore, minimization of the switching noise is satisfactorily achieved when the waveform of the output current will not present any other discontinuity beside the slope inversion point during the precharge phase. In practice this is obtained with a substantially triangular waveform of the precharge current.

The disclosed innovations implement these essential conditions. In the presently preferred embodiment, the disclosed innovative circuits comprise a first control block for an output pull-up branch (i.e. a transistor or a network equivalent thereto) and a second control block for an output pull-down branch (i.e. a transistor or a network equivalent thereto), which are driven by a first enable signal present on a first node of the circuit and a control signal. These two signals are applied to respective enable and control signal inputs of the two control blocks. At least a first inverter is functionally connected between an output node of the circuit and, through a first switch, to the control signal input of the first block. At least a second inverter is functionally connected between the output node and, through a second switch, to the control signal input of the second block. At least a third inverter, capable of driving, through a third switch said first node of the circuit during a precharge phase has an input which is capacitively coupled to a ground potential and connected through a fourth switch to the output node of the circuit. At least three more switches connect an input node of the circuit to the said control signal inputs of the two blocks during a switching phase and a static active phase of the circuit and to said first node of the circuit during a switching phase.

All the switches are driven by the use of two pairs of phase-opposed timing signals.

Advantageously the second inverter may have a threshold voltage which varies in function of the voltage which is present on said node of the circuit which is capacitively coupled to ground and which is connected to the output node of the circuit through said fourth switch at least during said switching phase and said static active phase, and disconnected from said output node during said precharge phase.

BRIEF DESCRIPTION OF THE DRAWING

The disclosed innovations will be described with reference to the accompanying drawings, which show important sample embodiments and which are incorporated in the specification hereof by reference, wherein.

DESCRIPTION OF THE PREFERRED EMBODIMENTS

Figure 1:
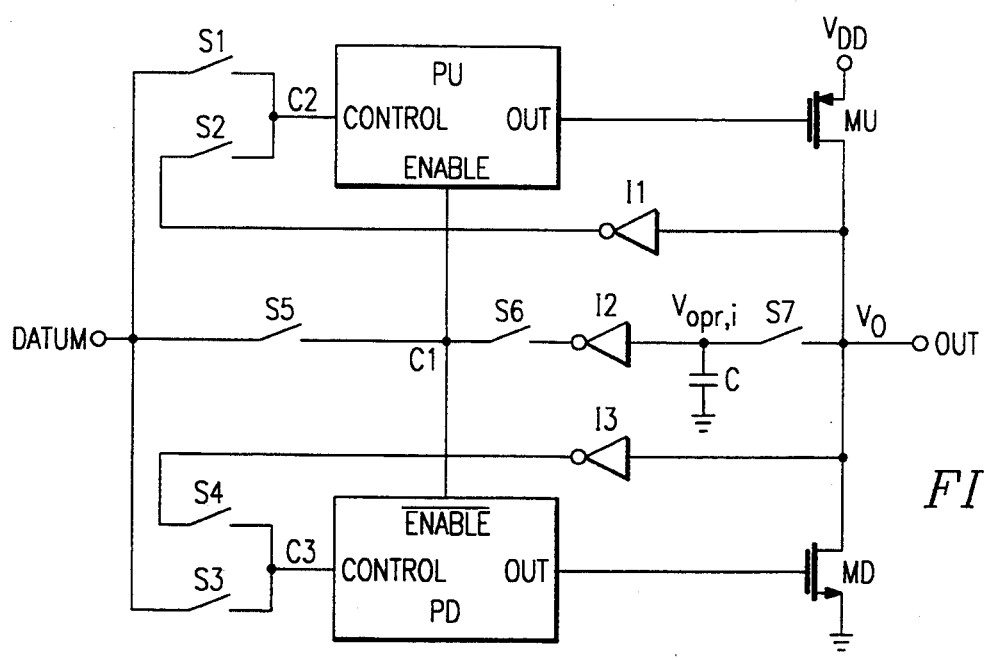
FIG. 1 is a functional block diagram of the disclosed innovative circuit.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

In consideration of the particular importance that such an application represents, the disclosed innovations will be described in relation to a utilization as a data output buffer for a memory device which may comprise 16 similar data output buffers integrated on the same chip.

According to common practice, these memory devices may assume three different operative states to which correspond different operative states of the data output buffers.

1) Standby phase. During this phase, the chip is disabled, and memory data output pins have to be kept in a high-impedance state. This is commonly effected by means of a dedicated control signal (SB) capable of causing, through the plurality of transistors dedicated to this purpose which are functionally connected in the circuits of the buffer, a non-conducting state of the pull-up and pull-down output branches of the buffer, in order to minimize power consumption during such an operative stand-by phase.

2) Read phase. During this operative phase the memory device is enabled, and the addressed memory cells are read. This operative phase is actually divided into three steps or periods. During a first step (read request identification period), the read request is identified and the input and addressing circuits are set. In a second step (sensing period), as defined by means of a dedicated timing signal CKO which is kept high during this step, the information stored in the addressed cells is sensed and decoded. In a third step or last step (data output transition period), which begins when the signal CKO undergoes a 1 to 0 transition), each data output node is brought to the voltage level corresponding to the value of the read datum ($V_{OH}$ or $V_{OL}$ for an "1" or a "0" logic state, of the respective addressed cell), by a relative output buffer.

3) Static active phase. During this phase, the chip is enabled and the data which have been previously read and latched, are continuously delivered through the data output pins of the device. During this operative phase, a low output impedance of the buffers is required.

In an application of this kind, the time interval of the read phase (CKO signal in a high state) may be exploited for presetting the output node to an appropriate intermediate voltage level without substantially affecting the access time of the memory. This approach is aimed at reducing the voltage step which must be produced on an output node for effecting the switching (i.e. during the third step of the operative read phase) whenever this becomes necessary. In this way, the amount of electrical charge, which must pass through the output (during the brief period of time in which the actual switching is performed), is reduced, and so is the peak amplitude of the current which must be delivered for performing the switching in a certain interval of time.

Of course, this precharge phase may be carried out only if there is a "dead" time between the instant when the system "senses" that a new datum will need to be transferred to the output and a subsequent instant when the logic level which needs to be transferred to the output is made available. Memory circuits represent a typical example of this because (through the passing of the circuit from a standby to an active condition or through a change of address signals) a read request is detected at first, and thereafter the memory cells corresponding to the new address are read, and finally the read data are transferred to the output terminals. Therefore, the period of time during which the memory cells are being read may be utilized for carrying out a precharge phase of the output nodes. The second condition implemented (i.e. the particular control exerted on the output current) has the purpose of minimizing the peak value of the time derivative of the output current delivered by the output buffer, and therefore minimizing the noise (LdI/dt) which is induced on the supply lines.

Figure 2A:
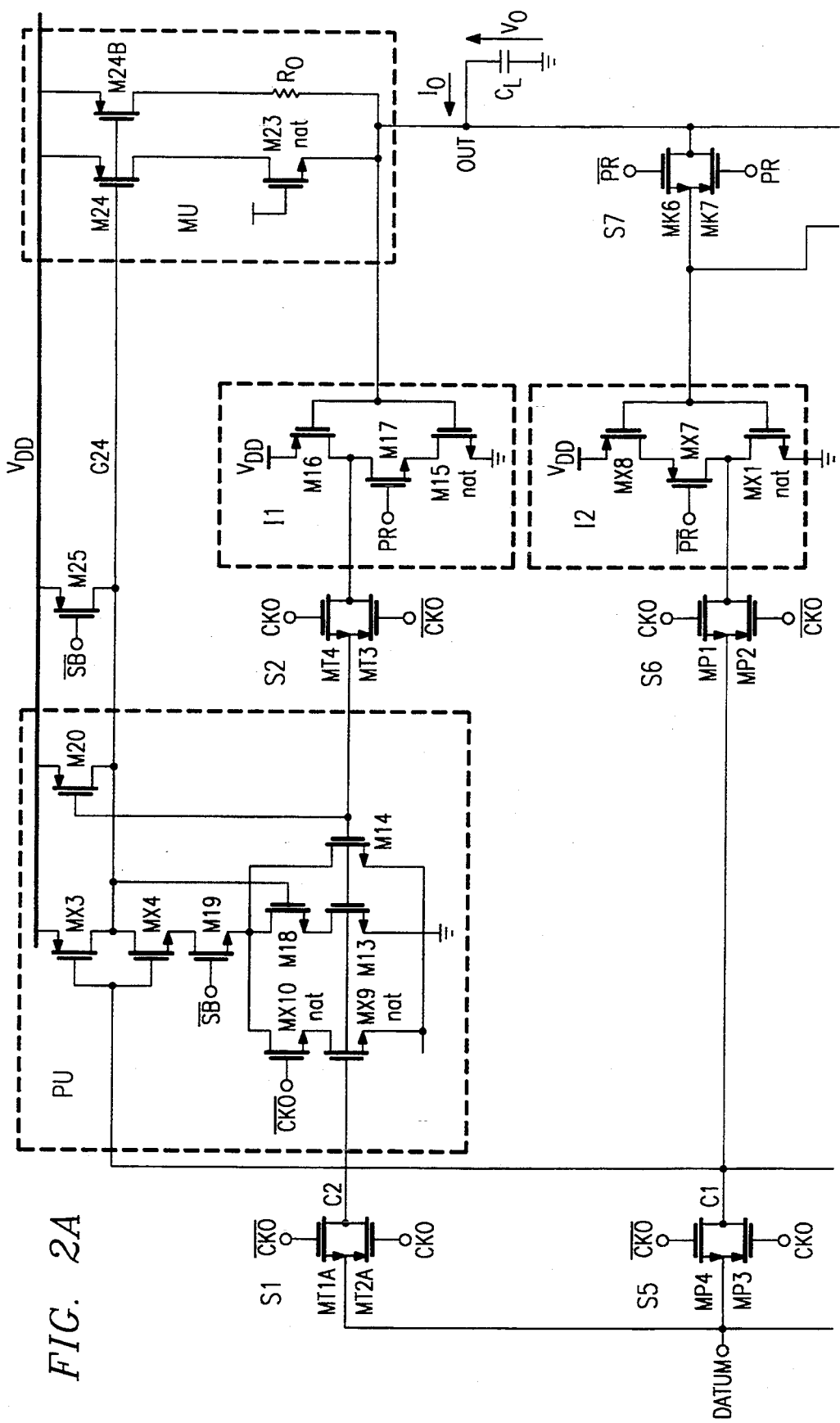
FIG. 2 is a circuit diagram of a sample specific embodiment of the invention.
Figure 2B:
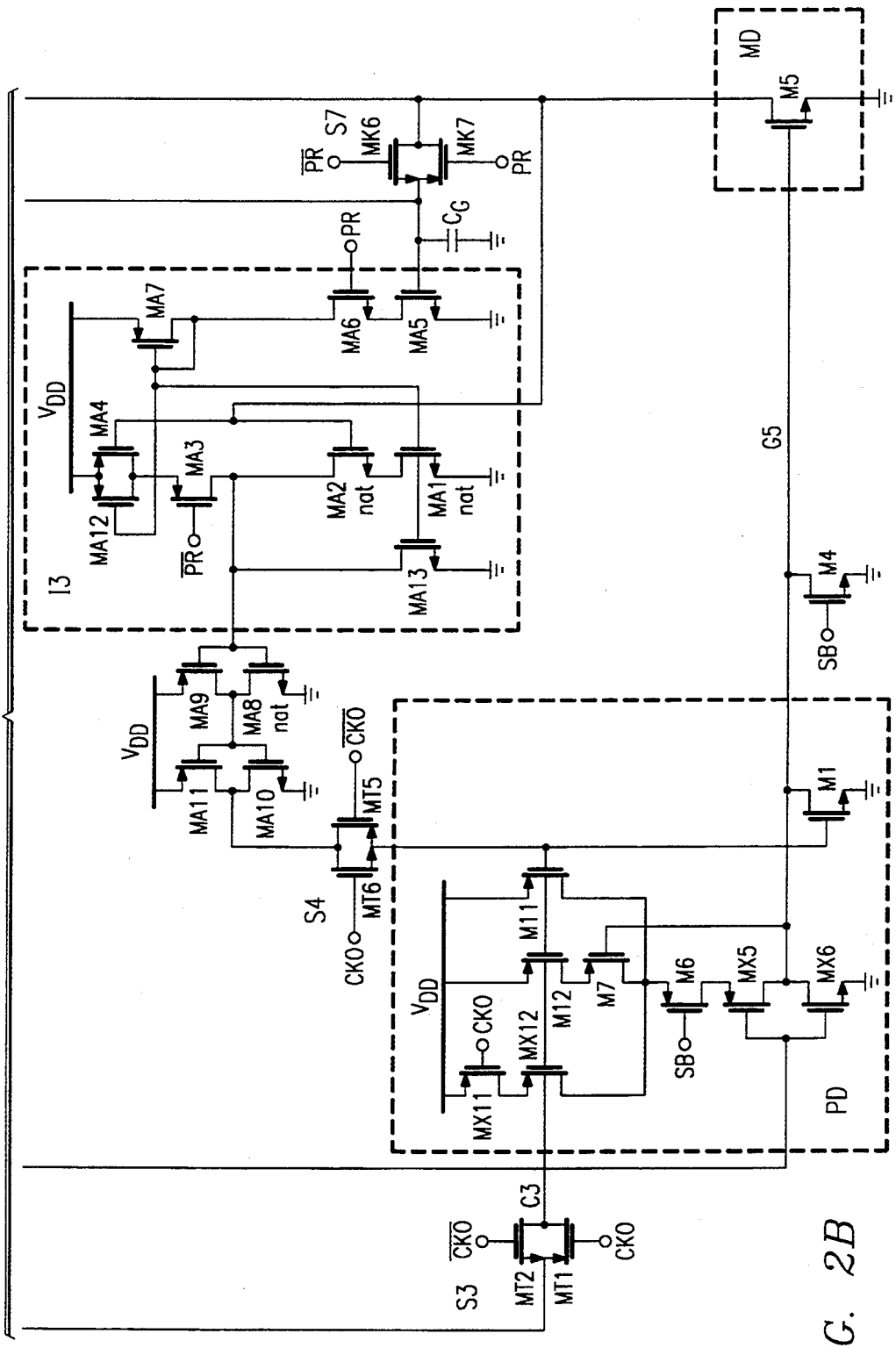

A functional block diagram of a buffer according to the disclosed innovative teachings is shown in FIG. 1. FIG. 2 shows a sample embodiment of the circuit, in which elements corresponding to the functional blocks of FIG. 1 are identified with dashed-line boundaries. In the circuit of FIG. 2, natural n-channel transistors are identified by the label nat.

Basically the timing signals which control the operating phases of the circuit are: SB (by which a standby condition of the circuit may be determined) and CKO (which, as said before, a read time interval for data to be transferred to the output nodes). Nevertheless the CKO signal may remain high also during a standby phase. Of course, it is assumed that also the respective inverted signals (SB\ and CKO\ ) be available, as they normally are.

For the purpose of achieving a precise identification of the read period of the memory cells, and in order to permit during such a period a presetting (precharging) of the output nodes, it is necessary to have an additional precharge control signal available, namely PR (and preferably also the complementary signal PR\ ), which may be conveniently generated as an AND signal of the CKO and SB signals, according to a common technique, as will be evident to one of ordinary skill in the art without the need to describe in detail the functional circuit which may be used for this purpose. The PR (PR\ ) signal will be high during the whole precharge of the output node phase and will be low during any other operative phase of the buffer.

In the following table the logic states of the control signals during the distinct operative phases of the disclosed innovative circuit are set forth.

| SB | CKO | Operating phase |
|---|---|---|
| 0 | 0 | Active state (outside a reading phase): PR = 0 |
| 0 | 1 | Reading phase of memory cells: PR = 1; (a precharge of the output node is carried out during this period) |
| 1 | 1 | Standby (PR = 0) |
| 1 | 0 | Nonexistent |

With reference to the figures, the switches depicted in FIG. 1 may be made as shown in FIG. 2; namely: the switch S1, composed of MT1A and MT2A (active when CKO is low); the switch S2, composed of MT3 and MT4 (active when CKO is high); the switch S3, composed of MT1 and MT2 (active when CKO is low); the switch S4, composed of MT5 and MT6 (active when CKO is high); the switch S5, composed of MP3 and MP4 (active when CKO is low); the switch S6, composed of MP1 and MP2 (active when CKO is high); and the switch S7, composed of MK6 and MK7 (active when PR is low). As a consequence, during a read cycle and in particular during a phase of transfer to the output of a new datum (i.e. the switching phase of the output buffer) and during a static active state of the circuit, the switches S1, S3, S5 and S7 are closed. The switches S2, S4, S6 are closed during a precharge phase. Finally, the switches S2, S4, S6 and S7 are closed during a standby phase. An operative standby phase may be present only in certain applications, while as far as the subject of the present invention is concerned, which is tied to the control of the output current during a precharge phase and during a subsequent switching phase for transferring the datum to the output, as well as, of course, during a phase of static retaining of the output level during a static active state, it is of some overall importance that the voltage at nodes C2 and C3 be controlled by the voltage of (or be equivalent to) the "datum" present at an input node of the buffer during the phase of transferring the datum to the output and during a subsequent static active phase. The nodes C2 and C3 must be controlled by the output voltage $V_0$ (through the inverters I1 and I3) during an output node precharge phase. The node C1 must be controlled by the datum present at the input of the buffer during a phase of transferring the datum to the output and during a static active phase. The node C1 must be controlled (through the inverter I2) by the voltage $V_{opr,i}$ which is present on the buffer output node at the beginning of a precharge phase, during the ensuing precharge phase, as will be pointed out later on in this description.

With reference to the functional diagram of FIG. 1, for each of the two control blocks PU (pull-up control) and PD (pull-down control) for the output transistors MU and MD, respectively, an enabling signal input (ENABLE) and a control signal input (CONTROL) may be recognized.

If the enabling signal input (ENABLE) of the PU block is low, the output signal of the block is always high, therefore the MU (pull-up) transistor is switched-off. When the enabling signal input (ENABLE) is high, the output of the PU block will be either high or low depending from the value of the control signal input (CONTROL): if the CONTROL node is also high, the output signal of the block becomes low, therefore the MU transistor is switched-on and charges the output node toward a higher voltage (maximum value=$V_{DD}$); if the CONTROL node is low, the output signal of the block is high and therefore the transistor MU is switched-off.

The operation of the PD block is similar. When the enabling signal input node (ENABLE\ ) is high, the output of the block PD is always low, therefore the MD transistor is switched-off. Conversely, when the enabling signal input node (ENABLE\ ) is low, then if the control signal input node (CONTROL) is also low, the output voltage of the block PD is at a high level, therefore the MD transistor is made conducting and discharges the output node toward a lower voltage value (minimum value=ground potential); if the control signal input node (CONTROL) is high, the output of the block PD goes low and therefore the MD transistor is switched off.

The voltage which is applied to the ENABLE and ENABLE\ terminals of the two control blocks PU and PD; respectively, is the same, i.e. the voltage which is present on the node C1 of the buffer circuit.

During a phase of transfer of a datum to the output and during a static active phase of the buffer, the two control blocks PU and PD have the data signal (DATUM), applied to their signal inputs because S5 is closed, S6 is open, S1 and S3 are closed, and S2 and S4 are open, so that the two control blocks PU and PD are controlled by the datum itself.

During a precharge phase, the "enabling" of the two control blocks depends on the value that the output node of the buffer had ($V_{opr,i}$), before the start of the precharge phase, by the use of the inverter I2, and in view of the fact that the switch S6 is closed, while S5 and S7 are open. Moreover the switches S2 and S4 are closed, while the switches S1 and S3 are open and therefore the two blocks PU and PD are "controlled" by the output voltage Vo, by the use of the inverters I1 and I3.

It may be easily observed that during a transfer phase of a datum to the output (and during a static active phase) the output voltage is brought to (or maintained at) the same logic level of the datum (DATUM) which is present on the input node of the buffer.

During a precharge phase, either the control blocks, PU or the control block PD is activated depending on whether the value of the existing output voltage $V_{opr,i}$ is low or high respectively. Because the CONTROL signals for the two blocks PU and PD are the output signals of the inverters I1 and I3, respectively, an input of which is connected to the output node of the buffer, a precharge of the output node toward a level opposite to the starting level is achieved. However when the voltage on the output node of the buffer will have dropped (or risen) by a certain amount, the inverter (I3 or I1) whose output provides the CONTROL signal to the enabled one of the two control blocks will switch, thus at a certain point, the output transistor which was conducting will be switched-off. Of course the other output transistor will remain off (since its control block is effectively disabled); hence at this point the precharge will have been terminated.

Each of the control blocks PU and PD implements a control of its output voltage whereby the value of the current delivered by the driven output transistor (MU or MD) varies in function of time by an approximately linear law, at least until the current delivered by the output transistor is determined essentially by its gate voltage level, i.e. until the conducting output transistor operates in a saturation zone of its characteristic. In practice, the enabled one of the two control blocks PU and PD, will generate an output voltage which substantially vary in function of the square root of time, thus the current delivered by driven output transistor (MU or MD) presents a linear, variation in function of time. Such a control is exerted by one or the other of the two control blocks during a transfer phase of the datum to the output during a precharge phase, therefore the switching noise is effectively minimized throughout all phases of operation of the buffer. When the output transistor which is conducting enters in a so-called triode-region of its characteristic (i.e. during a final portion of a switching phase) the output current will decrease without undergoing abrupt changes.

Figure 3:
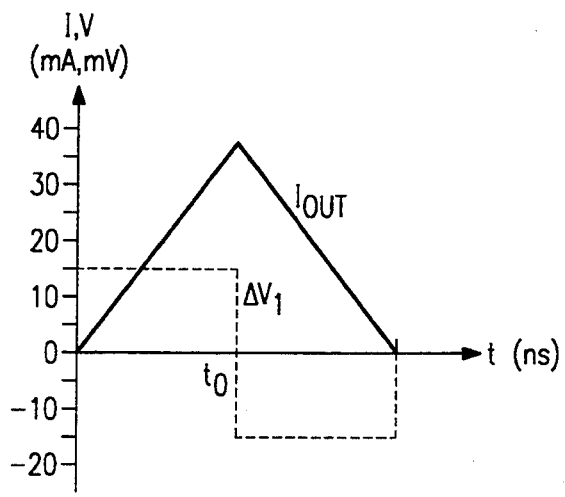
FIG. 3 is an output current diagram showing the ideal behavior of the waveform during a precharge phase.

It is important to note that during a precharge phase, at a certain instant $t_0$, i.e. at the instant when the output voltage reaches a certain pre-established value, the control signal (CONTROL) of the block which is active at that moment switches, nevertheless the block remains active. Upon the switching of the control signal (CONTROL), an inversion of the slope of the precharge current occurs. This precharge current which in absolute value was rising up to the instant $t_0$, after this instant begins to decrease and, after a certain interval of time will become null, thus ending the precharge process, as shown in the diagram of FIG. 3. This slope inversion of the output current during a precharge phase is obtained, in the presently preferred embodiment, by the use of the two inverters I1 and I3 which have different threshold voltages: I1 will generally have a threshold voltage lower than I3. The third inverter I2 has a threshold voltage which is preferably comprised between the threshold voltages of the other two inverters I1 and I3. The threshold voltages of the two inverters I1 and I3 must be designed accurately to ensue that the value of the output voltage at the end of a precharge phase will be as desired.

According to a preferred embodiment, for optimizing the operation of the circuit, and particularly for ensuring a good performance during precharge phases, whichever the value of the existing output voltage $V_{opr,i}$ is, the inverter I3 should preferably have a variable threshold, controlled by the value of the existing output voltage $V_{opr,i}$. It is particularly preferred that the threshold voltage of I3 decrease with a decrease of the value of the existing output voltage $V_{opr,i}$. This may be obtained, for example, with by the circuit depicted in FIG. 2. The gate voltage of the MA7 transistor depends from the value of $V_{opr,i}$, in a way that it decreases when the latter voltage increases. This determines a change of the current delivered by MA12, which increases with an increase of $V_{opr,i}$, and of the current delivered by MA13, which decreases when $V_{opr,i}$ rises, as well as of the "resistance" opposed by MA1 which increases with a rise of $V_{opr,i}$. This leads to an increase of the threshold voltage of the inverter I3 upon the rising of the value of $V_{opr,i}$ as desired. The two inverters composed of MA8 . . . MA11, which in the diagram of FIG. 2 are connected in cascade to the inverter I3 having a variable threshold, have the purpose of "squaring" the overall transfer characteristic of the inverter, in order to provide a control signal having an appropriate logic level to the PD block.

The circuit shown in FIG. 2 comprises also transistors capable of placing the buffer in a high output impedance state (i.e. for implementing a so-called "tristate" output circuit) when the device in a standby state (i.e. when the signal SB is high), thus reducing substantially to nil the current drain of the buffer circuit during such a standby phase.

In the circuit shown in FIG. 2, the pull-up transistor MU is replaced by a network composed of the transistors M23, M24, M24B and the resistor $R_o$ (which, it is contemplated, may eventually may have a substantially null value). This network represents a "pull-up branch" of the buffer. The purpose of this embodiment of the pull-up output branch is that of avoiding a direct connection to the output node of the buffer of a p-channel transistor capable of delivering a relatively high current, in view of the fact that to the output node is already connected and n-channel pull-down transistor typically having a relatively high W/L ratio. A direct connection of two complementary transistors having a high W/L ratio could in fact create latch-up problems.

Of course, the buffer shown is capable of maintaining a static output level for an indeterminate period of time during an active static condition of the buffer. This is also obtained by the control blocks PU and PD. In this operative phase, if the datum voltage level is high, the output of the PU block is low and also the output of the PD block is low, therefore the output pull-up branch is conducting while the output pull-down branch is off and therefore the output is maintained in a high logic state. The opposite occurs if the datum is a logic low.

Finally it should be noted that the two blocks PU and PD, because of the relationships between the respective driving signals, exclude a contemporaneous conducting state of the two output transistors, MU and MD, except during transient phenomena which, obviously must be limited to a minimum.

As it will be evident to a skilled technician, the operative phases of the circuit may be different from those described in relation to the embodiment shown in the figures and they may contemplate a different number of control signals and/or a different use thereof as compared to the control signals utilized in the example shown, namely CKO, PR and optionally also SB. Clearly a determination of the control signals which are needed or desired will depend on peculiar requirements of the application. For example, an additional control signal MEM may be used for the purpose of defining (determining) an active static condition, and so forth.

The most important field of application of the output buffer of the invention is in high-speed memories having a large number of output data pins. Of course, the disclosed innovative output buffer is useful also in other digital circuits wherein there is a need to drive relatively heavy capacitive loads at high speed, particularly external loads connected to the integrated circuit, with a high output parallelism. On the other hand, it is essential, in order to be able to perform a precharge phase, that the operation of the integrated circuit wherein the output buffer is used, present a "dead" time between an instant when the system senses that a new level, different from an existing one, must be transferred to the output, and a successive instant when a logic signal which must be transferred to the output is made available on the input node of the output buffer. Notwithstanding that this description refers to the case of an output buffer of an integrated circuit it is evident that the disclosed innovative buffer is suitable also to drive internal capacitive loads of the integrated circuit if particular conditions warrant the use of such a buffer, and by considering that primarily switching noise generation is a phenomenon tied to parasitic inductances of supply lines.

OPERATION OF AN OUTPUT BUFFER OF THE INVENTION

The operation of the circuit shown in FIG. 2, and particularly suited for a memory device, is as follows:

Output Transition

At the beginning of this period, the gate electrode of transistor M5 (G5) is at a low level while the gate electrode of transistors M24 and M24B (G24) is at a high level (it will be shown, in fact, that the output transistors are in the off state at the end of an output precharge phase). The initial output voltage is equal to $V_{OPR}$, which has an appropriate intermediate level between the $V_{DD}$ and $V_{SS}$ values, as will be shown later.

The output transition period begins when the signal CKO goes low. The logic level of the datum read from a memory cell is transferred onto nodes C1, C2 and C3.

Transistors MX10 and MX11 included in the driving circuits PU and PD are kept on during the output transition period (CKO=0) and can be regarded as short circuits.

If we assume that the read datum is a logic "0", the output node will need to be discharged from $V_{OPR}$ towards ground potential and the nodes C1, C2 and C3 are brought to a low level.

As far as the pull-up section of the buffer is concerned, the node C1 keep MX3 on and MX4 off, and the node C2 keeps M20 on (while MX9, M13 and M14 are kept off). Therefore, the node G24 is kept at a high level. Transistors M24 and M24B remain in an off state and the pull-up branch give no contribution to the output current.

With reference to the pull-down section, transistor MX6 is off, while transistors M6 and MX5 are on, and can be regarded as short circuits. Node C3 keeps transistors M11, M12 and MX12 on and transistor M1 off. The gate electrode of M5 begins to be charged through M11, MX12 and the series connection of M7 (which acts substantially as a diode) and M12. Therefore, M5 begins to conduct and allows the load capacitance CL of the buffer to be discharged. As the voltage on node G5 increases, thus increasing the output current sunk by M5, the voltage across the branch composed of M12 and M7 decreases, thus decreasing the value of the current flowing through the branch itself. Therefore, node G5 is charged with a current which decreases in function of time.

Figure 4:
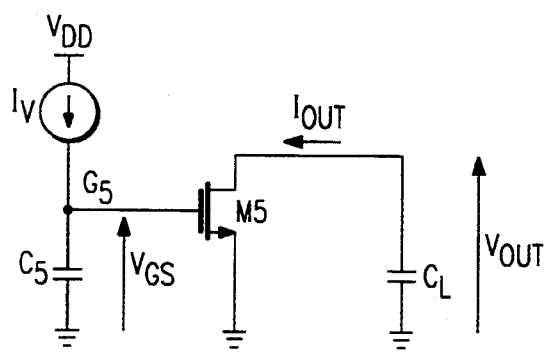
FIG. 4 is a sample embodiment of a circuit equivalent to an output pull-down portion of a buffer.

An equivalent diagram of the circuit which discharges the load capacitance is shown in FIG. 4, where $C_5$ and $I_V$ represent, the overall capacitance of node G5 and the time-dependent current sourced by the driving circuit PD to charge this capacitance, respectively.

Assuming that M5 works in its saturation region, the output current Iout is given by $$I_{out} = \frac{k'}{2} \frac{W_e}{L_e} (V_{gs} - V_{th})^2 \quad (1)$$

where k', We and Le are the conduction factor, the effective width and the effective length, respectively, of transistor M5, and $V_{gs}$ and $V_{th}$ are its gate-to-source voltage and its threshold voltage. By taking the time derivative, the following is obtained:

$$\frac{dI_{out}}{dt} = k' \frac{W_e}{L_e} (V_{gs} - V_{th}) \frac{dV_{gs}}{dt} \quad (2)$$

The current-voltage relationship of capacitor $C_5$ is given by $$I_v = C_5 \frac{dV_{gs}}{dt}. \quad (3)$$

By substituting equation (3) into equation (2), the following is obtained:

$$\frac{dI_{out}}{dt} = k' \frac{W_e}{L_e} (V_{gs} - V_{th}) \frac{I_v}{C_5} \quad (4)$$

To achieve a constant value of the time derivative of the output current $$\left( \frac{dI_{out}}{dt} \right),$$

the voltage difference $V_{gs} - V_{th}$ and the current $I_V$ must be inversely proportional to each other. Therefore, $I_V$ should decrease while $V_{gs}$ is increasing. In the driving circuit PD, as shown above, this is obtained by means of the series connection of diode-connected transistor M7 and transistor M12. Therefore, the output current $I_{out}$ shows a substantially linear variation with time, as long as M5 operates in its saturation region.

When M5 enters the so-called triode-operating-region, its current driving capability decreases. The design of the driving circuit PD and of transistor M5 may be optimized in order that, when the voltage on the G5 node reaches its maximum value (not above $V_{DD}$), the M5 transistor works in its triode-region and its drain current is controlled by the output voltage. Therefore, the output current $I_{out}$ decreases without any sharp variation until it reaches a static low level value thus preventing large voltage peaks from being induced across the parasitic inductance of ground lines.

If the read datum is a logic "1", then during the output transition period the output node will need to be charged from $V_{OPR}$ towards $V_{DD}$. Nodes C1 and C3 are at a high level, therefore the transistors MX6 and M1 are kept on, while MX5 is kept off and M11, M12 and MX12 are also kept off. Therefore, node G5 is kept at a low level and the pull-down transistor M5 remains in an off state. The operation of the driving circuit PU, when the read datum is "1", is similar to the operation of the driving circuit PD, when the read datum is "0". At the beginning of this period, the node G24 is assumed to be charged at the supply voltage $V_{DD}$. Transistors MX4 and M19 may be regarded as short circuits, therefore, node G24 is discharged through M14, MX9 and the series connection of M18 and M13, thus turning transistors M24 and M24B on. The current provided by the driving circuit PU to discharge node G24, decreases with increasing time, therefore the output current sourced by M24 increases with an almost constant time derivative until transistor M24 works in its saturation region and/or the gate-to-source voltage of transistor M23 is so large that it does not substantially affect the current driving capability of the branch composed of M24 and M23 (high-speed pull-up branch). When transistor M23 is switched off due to the increasing voltage applied to its source, transistor M24B provides the output current required to continue charging the load capacitance and to meet static high-level output specifications. Transistor M24B is included in the pull-up structure just for this purpose. Its contribution to the output current during fast dynamic operation is smaller than the contribution provided by M24; however, it should also be taken into account when optimizing the design of the buffer.

As in the previous case (read datum=0), the output current sourced by the pull-up structure is smoothly decreased from its peak value to its high-level static value thanks to the operating conditions of the output transistors, therefore no large voltage peak is induced across parasitic inductance across the $V_{DD}$ line.

Active Static Operation

This working condition of the buffer represents the continuation of a switching phase, and is not itself a "real" operating phase, and for this reason may not be unequivocally defined by the control signals SB and CKO. During this phase, the datum which has been previously read and latched, has to be continuously available on the output node, with a low impedance driving condition.

If the read datum is "0", nodes G5 and G24 are kept at a high level. Transistors M24 and M24B are kept in an off state, while transistor M5 is kept on, therefore the output node is forced to ground potential with a low output impedance.

If the read datum is "1", nodes G5 and G24 are kept at a low level. Transistor M5 is kept off, while transistors M24 and M24B are kept on, thereby forcing the output node to a high level with a low output impedance.

As pointed out above, to reduce the possibility of latch-up, it is preferable to avoid a direct connection of a large, pull-up, p-channel transistor to the output node, because a large n-channel, pull-down, transistor (M5) is already connected thereto. Therefore, an n-channel, device, M23 (e.g. a natural transistor) may be advantageously connected in series with M24. To meet high-level output static specifications, a p-channel transistor M24B may be connected in parallel to the high-speed pull-up branch, as shown. The aspect ratio W/L of this transistor may be designed so as to make it capable of driving just the current required by static, high-level, output specifications, and therefore it may have drastically smaller dimensions than transistor M24. Finally, a resistance $R_o$ may be connected in series to M24B in order not to degrade the circuit reliability as far as latch-up possibility is concerned.

Output Precharge Phase

A precharge phase begins when the signal PR goes high.

In the analysis of the circuit operation during an output presetting phase (SB=0, CKO=1, and therefore PR=1), the case when the output node is initially at a low level (ground potential) will be considered first. In this case, during the output presetting period, the output node must be charged to $V_{OPR}$. Node G24 is initially at a high level, and transistors M24 and M24B are in a an off state. The output voltage $V_{Oi}$, present at the beginning of the precharge period, is stored on the internal capacitance $C_G$, and controls the node C1 through the inverter I2 (which for example may have a nominal threshold value of $V_{T2}=1.6$ V) and the following transfer gate S6 (composed of the transistors MP1 and MP2). The node C1 is forced high, so node G5 is forced to ground potential and transistors M5 is kept in an off state during the whole output presetting period. It should be noted that when a read operation has to be carried out starting from a static active phase in the presence of a low initial output voltage, the node G5 is initially at a high voltage, therefore it must be discharged to ground potential at the beginning of the output presetting (precharging) period. The discharge of the node G5 is made fast enough to allow a fast start of the charging of the load capacitance through the pull-up branch and substantially prevent crossover currents from flowing through the output pull-up and pull-down structures which are connected in series across the supply rails.

The output node was assumed to be initially at a low level, so the input node of the inverter I1 (which may for example have a nominal threshold voltage $V_{T1}=1.1$ V), and which controls the node G2, is at a high level. Because the node G1 is also at a high level, at the beginning of the output precharge period, the driving circuit PU is substantially in the same working conditions as during an output transition period when a high level has to be delivered to the output terminal (the only difference relates to MX10 which is kept off during a precharging period). Therefore, the node G24 is discharged under the control of the driving circuit PU. The resulting current delivered through the output by the transistor M24 increases with time, showing an approximately constant time derivative. The value of the current which discharges the node G24 during the output precharge period is somewhat smaller than during the output transition period because the transistor MX9 gives no current contribution to the process of discharging the node G24. In fact, during an output transition period, a slightly faster discharge of the gate electrodes of the transistors M24 and M24B is required because they operate with a lower drain-to-source voltage. When the output voltage reaches the threshold level $V_{T1}$, the output voltage of the inverter I1 goes low, and transistors M13 and M14 are switched off while transistor M20 is switched on. Therefore, node G24 is increasingly charged toward $V_{DD}$ and the output current sourced by the transistors M24 and M24B decreases with the progressing of time. In practice, the digital switching of the output of the inverter I1 causes an inversion in the slope of the output current ramp, in accordance with the waveform shown in FIG. 3. Thanks to a proper sizing of the transistors which implement the driving circuit PU, transistors M24 and M24B are smoothly brought to an off state before the output precharge period is over. Therefore, when the output transition period begins and the control of the output buffer is returned to the datum node, the output precharge current has already dropped to zero and therefore sharp variations of the output current are prevented.

The buffer operation when the output node has to be discharged from an initial high level to VOPR during a precharge period of the output node is similar to the operation in the opposite case described above. During this period, the node C1 is kept at a low level, therefore transistors M24 and M24B are kept in an off state. The driving circuit PD charges the gate electrode of transistor M5, which becomes capable of sinking the current required to discharge the output capacitance $C_L$. The circuits PD and PU are similar, and the control of the two blocks is performed by similar techniques, therefore the same considerations and features discussed above are also applicable to this case. The node G5 is first recharged and then discharged according to a law which ideally provides a linear increase and a linear decrease, respectively, of the output current sunk by M5. The output current at the end of the precharge period is null. Also in this case, a high speed of operation is ensured and crossover currents through the output structures at the beginning of the precharge period are prevented.

However, in this case, the inversion of the slope of the output current ramp is performed by the use of a control circuit which is based on an inverter I3, having a variable threshold voltage, which is composed of the transistors MA1–MA4, MA12, MA13, and transistors MA5, MA6 and MA7 which generate a threshold adjustment voltage. In fact, in order to ensure an optimum operation of the buffer during the output precharge period, the current value of the output voltage $V_{out}$, which causes a slope inversion of the discharge current ramp, must be a function of the initial output voltage, $V_{Oi}$. To reach the nominal voltage $V_{OPR}$ which may be equal to 1.8 V, the slope inversion should occur when the $V_{out}$ reaches 3.4 V when $V_{Oi}$ is 5 V, or 2.1 V when $V_{Oi}$ is 2.4 V respectively. If an inverter having a fixed threshold voltage $V_{T3L}$ is used and if the threshold voltage is relatively low, e.g. 2.1 V, in the presence of a high initial output voltage, the output current sunk by M5 during the whole precharge period could make the output voltage too low at the end of the precharge period. If an inverter with a fixed threshold voltage ($V_{T3H}$) and having a relatively high threshold voltage: e.g. 3.4 V, is used, in the presence of an initial output voltage lower than ($V_{T3H}$), no discharge of the load capacitance would occur, and the output voltage would remain unchanged until the beginning of the following output transition phase. This type of problem is not present when, during the output precharge period the output node must be precharged from a low level to VOPR by the driving circuit PU. In that case in fact, the initial output voltage may vary within a range which is much smaller than in the case when the output node has to be discharged and the output precharge operation is suitably performed using a conventional fixed threshold inverter (I1) having an appropriate threshold voltage.

Advantageously, the output voltage which is present at the beginning of a precharge period, and which is stored in the internal capacitance $C_G$, causes a change of the threshold voltage ($V_{T3}$) Of the inverter I3. It is easily seen that the threshold voltage ($V_{T3}$) increases when $V_{Oi}$ is large and decreases when $V_{Oi}$ is low, as required. The nominal threshold voltage of the inverter is modified within a certain range in function of the initial output voltage $V_{Oi}$, which may vary for example, from 2 V to 5 V. This ensures a correct operation of the buffer with any value of $V_{Oi}$ fitting within the range from $V_{SS}$ to $V_{DD}$. The two inverters connected in cascade to the inverter I3 and composed of transistors MA8 to MA11, provide a squaring in the transfer characteristic of the inverter, and thus ensure output voltage levels suitable to correctly drive the control block PD.

Due to propagation delays, the slope of the output current ramp is actually inverted with some delay after the instant when $V_{out}$ reaches the predetermined threshold value ($V_{T1}$ or $V_{T3}$). Therefore, additional charge is delivered to the output capacitance before the ramp slope inversion takes place. The effect of this contribution on the voltage present on the output terminal at the end of the precharge period depends on the value of the load capacitance $C_L$ and therefore the design of the buffer may be optimized to meet maximum-load specifications.

The voltage applied to the input of the inverter I2 may be the initial output voltage $V_{Oi}$, as sampled on the capacitance $C_G$. The output node of the inverter I2 drives the node C1 during the output node precharge period. In turn, the node C1 drives both control blocks PU and PD by means of the transistors MX3, MX4, and MX5, MX6 respectively. In this way, a better control of the output current is achieved also in the presence of a relatively small load capacitance. For instance, it may be assumed that the output node must be discharged during a precharge period and that such an additional control be absent. When $C_L$ is relatively small, the output voltage $V_{out}$ may reach a value which is lower than the threshold voltage $V_{T1}$ during the output node precharge period. Therefore, the node G24 would be discharged and as a consequence the transistor M24 would provide a non-negligible output current. Therefore the waveform of the output current would be different from the desired one. Moreover, a sharp variation of output current could occur if transients are not over before the end of the precharge period, when the ensuing output transition phase requires an inversion of the polarity of the output current. A similar problem would occur when the load capacitance need to be charged from a low level to $V_{OPR}$ during an output node precharge period. In the embodiment of a buffer object of the present invention shown in FIG. 2, the node C1 is maintained at a correct voltage level during the whole precharge period, because the sampled output voltage $V_{Oi}$ is utilized as an input control voltage and therefore the above noted problems are prevented.

Standby

During a standby period (SB=1, CKO=1), the transistors M5 and M24 and M24B are kept in an off state. Therefore, the upward node is maintained in a high impedance state as required.

Current Consumption

During standby, the output node voltage is undetermined because the output terminal can be either floating or controlled by an external circuit. When the device is in an active phase, the output voltage is at a value comprised between the specified dynamic and static levels for some time interval after a specified access time. Therefore, the inverters I1, I2, and I3, which are required to work only during the output preset period, may be conveniently disabled when the device is not in this working phase, in order to minimize the power consumption of the buffer during standby as well as during active static phases. Disabling is implemented by the signals PR and PR.

The two inverters connected in cascade to the variable-threshold inverter I3 do not need disabling as the "output node" of I3 is tied to ground when the buffer is not in a output precharge phase of operation.

During standby, the signal SB is kept high and therefore the driving circuits PU and PD do not draw any bias current, regardless of the value of the output voltage.

During a static active operation, the nodes C1, C2 and C3 are controlled by the DATUM line, which may be placed at a "1" or "0" logic level depending for example, on the content of the read cell memory when the sensing period is over. Therefore, during this phase, when all transients are over, the two driving blocks PU and PD do not draw current.

Therefore, the power dissipation of the output buffer during standby and static active phases of operation is due solely to leakage currents.

During output precharge and transition phases, as well as during the transients following an output transition phase, a number of internal circuit nodes must be charged or discharged, therefore the current consumption of the buffer cannot be neglected. However, as already shown above, the buffer may be provided advantageously with circuit arrangements capable of minimizing the crossover currents and this further contributes to reduce the noise which is induced on the supply lines, besides limiting consumption.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

The disclosed innovative circuit has been designed into a 16M EPROM memory. However, the disclosed inventions are also useful in any type of memory (in most of these circuits there will be a "dead" time represented by the time necessary for addressing the cells and for sensing them).

The disclosed innovations are particularly advantageous in byte-wide memories. More generally, the disclosed innovations are particularly advantageous in chips with simultaneous output on multiple lines, in any type of circuit where a substantially capacitive load must be driven while maintaining high speed and short output switching time.

Thus, the disclosed innovative teachings can also be applied to complex logic chips, such as microprocessors, ASICs, or gate arrays, or to telecomm chips.

In order of fully exploit the advantages offered by the invention, it is preferable that the architecture of the circuit wherein the buffer is used (or in other words the mode of operation of the circuit) be such as to have a "dead" time. (Memories will typically have such a "dead" time, because of the address set-up and sensing times). If the precharge of the output node to an intermediate voltage is carried out during this "dead" time, the system will not "see" the performance of the precharge as an additional operating, therefore, speed will not be affected.

Alternatively and less preferable, it is also possible to exploit the inventions when such a "dead" time does not exist. In this case, the precharge time will constitute a portion of the total time between a command (e.g. a read command) and the consequent output switching. Thus, the access time of the chip would be degraded, but the objective of reducing the switching noise would still be achieved.

Note that at least some of the advantages of the invention would still be obtained if a short period of constant current were interposed at the instant when the sign of the time derivative of the current during the precharge phase inverts itself, i.e. at the instant when the output current from a rising phase passes to a decreasing phase. (Thus, in FIG. 3, the peak of the triangular shape would be slightly flattened.) In practical embodiments, this may easily happens. For example, there may be a certain delay for the sign inversion to occur because the maximum value of the output current is limited by intrinsic buffer's characteristics, such as the size of the output transistors. Nevertheless, in an ideal case, the curve of the output current should approach as much as possible a triangular shape, in order to obtain the best compromise between peak of the derivative of the output current (i.e. switching noise level) and switching time. In other words, if the time during which the output current levels off (remains constant) is too long, the time required for the precharge operation (which will be increased thereby) may become excessive, and the overall performance may therefore become unsatisfactory.

In alternative embodiments, other events may be used to trigger the precharge operation. For example, to provide maximal "streaming" output for sequential accesses, it may be preferable (if power dissipation considerations permit this) to reactivate the precharge phase as soon as the output data has been stable for a certain time duration.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A method for operating an integrated circuit which is connected to receive first and second supply voltages, comprising the steps of:
   (a.) upon occurrence of a precharge command,
      (i.) beginning internal generating of a signal for output to external circuit elements, and also
      (ii.) controlling at least one output buffer to precharge a respective corresponding output connection to a voltage which is intermediate between said first and second supply voltages;
         ((1)) said output buffer performing said precharge operation with a waveform which includes a period of smoothly increasing output current having a limited maximum time derivative which is determined by a control circuit rather than by said output buffer, followed by a period of smoothly decreasing output current; and
   (b.) when said signal for output to external circuit elements has been generated, then driving a data input of said output buffer in accordance with at least a portion of said signal, and driving said respective corresponding output connection, using said output buffer toward one of said supply voltages, in dependence on the value of said portion of said signal.

2. The method of claim 1, wherein said step (b) of driving said respective corresponding output connection, using said output buffer, is performed using a controlled and limited rate of change of current.

3. The method of claim 1, wherein said step (b) of driving said respective corresponding output connection, using said output buffer, is performed using a controlled and limited rate of change of current which is equal to the rate of change of current during said periods of smoothly increasing and smoothly decreasing current during said precharge operation.

4. The method of claim 1, wherein said period of smoothly increasing output current is immediately followed by said period of smoothly decreasing output current.

5. The method of claim 1, wherein said step (b) of driving said respective corresponding output connection, using said output buffer, is performed using a rate of change of current which is equal to the rate of change of current of said step (a).

6. A method for operating an integrated circuit which is connected to receive first and second supply voltages, comprising the steps of:
   (a.) upon occurrence of a precharge command,
      (i.) beginning internal generating of a multibit signal for output to external circuit elements, and also
      (ii.) controlling multiple output buffers to each precharge a respective corresponding output connection to a voltage which is intermediate between said first and second supply voltages;
         ((1)) said output buffer performing said precharge operation with a waveform which includes a period of smoothly increasing output current having a limited maximum time derivative which is determined by a control circuit rather than by said output buffer, followed by a period of smoothly decreasing output current; and (b.) when said signal for output to external circuit elements has been generated, then driving a data input of said output buffer in accordance with at least a portion of said signal, and driving said respective corresponding output connection, using said output buffer, toward one of said supply voltages, in dependence on the value of said portion of said signal.

7. The method of claim 6, wherein said step (b) of driving said respective corresponding output connection, using said output buffer, is performed using a controlled and limited rate of change of current.

8. The method of claim 6, wherein said step (b) of driving said respective corresponding output connection, using said output buffer, is performed using a controlled and limited rate of change of current which is equal to the rate of change of current during said periods of smoothly increasing and smoothly decreasing current during said precharge operation.

9. The method of claim 6, wherein said period of smoothly increasing output current is immediately followed by said period of smoothly decreasing output current.

10. The method of claim 6, wherein said step (b) of driving said respective corresponding output connection, using said output buffer, is performed using a rate of change of current which is equal to the rate of change of current of said step (a).

11. A method for operating an integrated circuit which is connected to receive first and second supply voltages, comprising the steps of:

(a.) upon occurrence of a precharge command,
   (i.) beginning internal generating of a signal for output to external circuit elements, and also
   (ii.) controlling at least one output buffer to precharge a respective corresponding output connection to a voltage which is intermediate between said first and second supply voltages;
   ((1)) said output buffer performing said precharge operation with a waveform which includes a period of smoothly increasing output current closely followed by a period of smoothly decreasing output current, said periods of increasing and decreasing current both being limited to equal maximum time-derivatives of current; and (b.) when said signal for output to external circuit elements has been generated, then driving a data input of said output buffer in accordance with at least a portion of said signal, and driving said respective corresponding output connection, using said output buffer toward one of said supply voltages, in dependence on the value of said portion of said signal.

12. The method of claim 11, wherein said step (b) of driving said respective corresponding output connection, using said output buffer, is performed using a controlled and limited rate of change of current.

13. The method of claim 11, wherein said step (b) of driving said respective corresponding output connection, using said output buffer, is performed using a controlled and limited rate of change of current which is equal to the rate of change of current during said periods of smoothly increasing and smoothly decreasing current during said precharge operation.

14. The method of claim 11, wherein said period of smoothly increasing output current is immediately followed by said period of smoothly decreasing output current.

15. The method of claim 11, wherein said step (b) of driving said respective corresponding output connection, using said output buffer, is performed using a rate of change of current which is equal to the rate of change of current of said step (a).

16. A method for reducing the switching noise caused by a buffer circuit capable of generating a current for bringing to a preestablished voltage an output node in function of a certain logic signal applied to an input node of the buffer, which comprises the steps of:

precharging said output node to an intermediate voltage between a pre-existent voltage of said output node and a different pre-established voltage by a current having a time derivative which is substantially constant and of a first sign during a first time interval and a time derivative which is substantially constant and of a sign opposite to said first sign during a second time interval;

performing a switching of the output voltage to said different pre-established voltage by a current having a time derivative which is substantially constant during a third time interval.

17. The method of claim 16, wherein a precharge phase of the output node to said intermediate voltage is performed before said logic signal which is applied to the input mode applied to the control node of a voltage pull-up and a voltage pull-down branch of said output node of the buffer.

18. The method according to claim 17, wherein the inversion of sign of the time derivative of the output current during a precharge phase is accomplished by inverting the signal which is applied to said control node of the conducting one of said pull-up and pull-down branches.

19. The method according to claim 16, wherein said time derivatives during said first and second interval of time have a substantially identical absolute value.

20. The method according to claim 19, wherein said time derivative during said third time interval has an absolute value which is substantially equal to the absolute values of said time derivatives during said first and second time intervals.

21. A buffer circuit for high-speed driving a capacitive load connected to an output node of the circuit, in function of a signal applied to an input node of the circuit with a low switching noise, comprising:

a first control block for a pull-up, output branch and a second control block for a pull-down, output branch, driven by a first or enabling signal, present on a first node of the circuit and a second or control signal which are fed to respective inputs of said control blocks;

a first inverter, functionally connected between said output node, and, through a first switch, a control signal input node of said first control block, during an output node precharge phase;

a second inverter, functionally connected between said output node and, through a second switch, to a control signal input node of said second control block, during said precharge phase;

a third inverter, capable of driving said first node of the circuit during said precharge phase and connected thereto through a third switch, and having an input node which is capacitively coupled to ground potential and connected, through a fourth switch to said output node, at least during a switching phase and an active static phase of the operation of the buffer; and switch means, capable of connecting said input node to said control signal input nodes of said control blocks and to said first circuit node, during said switching phase of the buffer;

said switches and switch means being driven by a first and a second pair of control signals.

22. The circuit of claim 21, wherein said second inverter has an input which is connected to said input node of said third inverter capacitively coupled to ground and connected to said output node of the buffer through said fourth switch and has a threshold voltage which is variable in function of the voltage present on said node capacitively coupled to ground at the start of a precharge phase.

23. The circuit of claim 21, wherein said output pull-up branch is composed of a network having a first branch which is substantially constituted by a pair of complementary transistors, functionally connected in series among each other, and wherein a first p-channel transistor has a source connected to a supply node while the complementary n-channel transistor has a source connected to the output node of the circuit and a gate connected to a constant voltage, and a second branch constituted by a second p-channel transistor having a drain connected through a resistance to said output node of the circuit; the gate of said first p-channel transistor and the gate of said second p-channel transistor being driven by the same signal.

24. The circuit of claim 21, wherein between the output node of said second inverter having a variable threshold and said second switch there are two additional inverters connected in cascade, capable of squaring the overall transfer characteristic in order to provide appropriate logic levels to the control signal input of said second control block.

25. The circuit of claim 21, further comprising means, driven by a third pair of control signals, capable of determining a high output impedance condition of the circuit, for reducing the current drawn by the circuit during a stand-by phase of operation.

26. The circuit of claim 25, wherein said means comprise at least a third p-channel transistor driven through a gate terminal thereof by a first signal of said third pair of control signals and functionally connected between a supply node and a driving node of said pull-up output branch and by a second n-channel transistor, driven through a gate terminal thereof by the other signal of said third pair of control signals and functionally connected between a driving node of said, pull-down, output branch and ground.

27. The circuit of claim 25, wherein said first pair of control signals and said third pair of control signals are in-phase among each other, during a static active phase or a stand-by phase of operation of the circuit and in phase-opposition among each other during, an output node precharge phase of operation and the direct signal of said second pair of control signals is produced on the output node of a logic AND gate circuit, to the input of which the direct signal of said first pair of control signals and the inverted signal of said third pair of control signals are fed.

* * * * *